Sept. 19, 1967 W. T. H. HETTERSCHEID ETAL 3,343,061

TRANSISTOR CIRCUIT FOR DEVELOPING A HIGH VOLTAGE
AND INCLUDING SHORT-CIRCUIT PROTECTION MEANS

Filed Oct. 12, 1964 4 Sheets-Sheet 1

INVENTORS
WILHELMUS Th. H. HETTERSCHEID
JOHANNES J. REICHGELT
BY
Frank R. Jeffer
AGENT INVENTORS
WILHELMUS Th. H. HETTERSCHEID
JOHANNES J. REICHGELT
BY
Frank R. Trifari
AGENT INVENTORS
WILHELMUS Th. H. HETTERSCHEID
JOHANNES J. REICHGELT
BY
Frank R. Jifari
AGENT INVENTORS
WILHELMUS Th.H.HETTERSCHEID
JOHANNES J. REICHGELT
BY
Frank R. Trifari
AGENT

United States Patent Office 3,343,061

Patented Sept. 19, 1967

3,343,061

TRANSISTOR CIRCUIT FOR DEVELOPING A HIGH VOLTAGE AND INCLUDING SHORT-CIRCUIT PROTECTION MEANS

Wilhelmus Theodorus Hendrikus Hetterscheid, and Johannes Joseph Reichgelt, both of Mollenhutseweg, Nijmegen, Netherlands, assignors to North American Philips Company Inc., New York, N.Y., a corporation of Delaware Filed Oct. 12, 1964, Ser. No. 403,061
Claims priority, application Netherlands, Oct. 10, 1963, 299,091; Feb. 13, 1964, 64—1,221
11 Claims. (Cl. 321—2)

ABSTRACT OF THE DISCLOSURE

A transistor circuit for developing a high voltage, for example in a television line deflection circuit, incorporates means for preventing damage to the output transistor in the event of short circuits in the high voltage part of the circuit. An impedance in the output circuit limits the transistor current, and a negative feedback from the limiting impedance to the driver transistor counteracts the input pulsatory voltage to inhibit or delay conduction in the driver transistor in the event of a short circuit. This results in the prevention or delay of cutting off of the output transistor, in order to reduce damage to the output transistor due to the current contraction effect.

This invention relates to transistor circuit-arrangements for producing a high voltage, of the type comprising a driver transistor, an output transistor having an output circuit which includes a capacitive-inductive load, and a supply voltage source for feeding the driver and output transistors. In this circuit a more or less pulsatory signal is applied to an input electrode of the driver transistor. The signal cuts off the driver transistor for the greater part of a cycle of the input signal and releases it during the remaining part of a cycle. A coupling is provided between the driver and output transistors such that the output transistor is conducting when the driver is cut off and conversely. A transformer is provided in the output circuit of the output transistor, for stepping up the pulsatory voltage set up across the capacitive-inductive load during the moments when the output transistor is cut off, and a rectifier circuit is provided for rectifying the stepped up pulsatory voltage.

Such a circuit arrangement is used for example in television equipment in which the high voltage generated is used for feeding the output anode of the display tube. In such arrangements a sawtooth current through the deflection coil, which in this case constitutes substantially the inductive load in the collector circuit of the output transistor, is also produced for deflecting the electron ray in the display tube.

Such arrangements have the disadvantage, especially when using transistors, that they can be damaged by short-circuits. A short-circuit in a display tube may occur due to the aquadag layer on the inner side of the glass wall being connected to the second acceleration anode of the electrode system so that, when the aquadag layer is brought to the high acceleration voltage, flash-over may occur between the said second anode and one control electrode of the electrode system. The flash-over may be regarded as a short-circuit.

Especially in new display tubes which still contain small residues of dust particles or still exhibit, burrs, flash-over may occur during 5 to 10 line periods. As a result of such flash-over the dust particles are burnt or the burrs disappear so that after some time flash-over will substantially no longer occur. Also gas residues may have remained in the new display tube and these still have to be absorbed by the getter present in the tube. True the display tube is tested after manufacture and the necessary supply voltages are then applied, but in bulk manufacture of display tubes such a test can never be of a duration as long as is necessary for burning any dust residues or absorbing any gas residues by the getter.

Consequently the possibility of flash-over still exists after incorporation of the display tube in television equipment.

Another possibility of short-circuit may occur during service operations if, for example, the high-tension supply is short-circuited with respect to earth by means of a screw driver.

When a valve, for example a pentode, is used as a line output switching element any short-circuit occurring in the rectifier circuit for the high-tension supply cannot deteriorate the valve since the impedance of a valve is high enough to limit the current produced to a safe value. Further, as will be explained more fully hereinafter, the voltage across the switching element during the fly-back period, when the switching element is cut off, may increase more strongly, immediately after cutting off as a result of the short-circuit. Valves usually do not suffer therefrom, in contrast with transistors which are affected thereby due to the so-called contraction effect. Consequently there is a fairly great possibility that a transistor in such a circuit arrangement is deteriorated as a result of short-circuit occurring.

Since, as demonstrated hereinbefore, the flash-over effect occurs especially in new display tubes the output transistors employed as switching elements in the line output stage will be deteriorated more particularly in equipment freshly installed which is, of course, an undesirable situation since the customer, receinving a new apparatus, would be obliged immediately to have repairs made.

The circuit arrangement according to the invention solves this problem and is characterized in that, in order to safeguard the output transistor upon occurrence of short-circuit at the high tension side, a limiting impedance is included in series with the load on the output transistor, a negative feedback being provided to ensure that the voltage developed across the limiting impedance upon occurrence of the said short-circuit is fed back to the input electrode of the driver transistor so that the release of the driver transistor by the input signal is counteracted.

In order that the invention may be readily carried into effect, several embodiments thereof will now be described in detail, by way of example, with reference to the accompanying diagrammatic drawings, in which.

Figure 1:
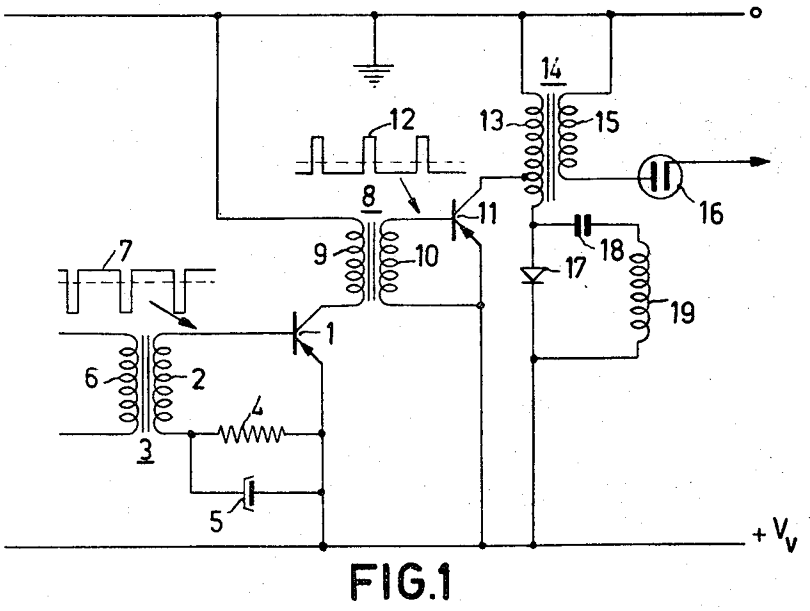
FIGURE 1 shows a known type of transistor line output circuit including an output transistor and a driver transistor.

Referring to FIGURE 1, the base of a driver transistor 1 is connected through a secondary winding 2 of a transformer 3 and the parallel combination of a resistor 4 of, for example, 100 ohms and a large capacitor 5 of, for example, 2.5 $\mu$F to the emitter of transistor 1. The emitter is also connected to the positive terminal of a supply voltage source which provides a supply voltage of $V_v$ volts and the negative terminal of which is connected to ground. A pulsatory signal is applied to a primary winding 6 of transformer 3 such that a substantially pulsatory signal 7 is active at the base of transistor 1. This signal will cut off the said transistor during the greater part of a cycle of the signal 7 and release it only for a short period. If the circuit arrangement described is used for feeding a display tube and also provided for horizontal deflection of the electron ray in this tube, the cut-off period of the driver transistor 1 will correspond to the horizontal stroke period and the period of release of transistor 1 will substantially correspond to the horizontal fly-back period.

The output circuit of transistor 1 includes another transformer 8 the primary winding 9 of which is connected between the collector of the driver transistor 1 and the grounded terminal of the supply voltage source. The winding sense of the secondary winding 10 of transformer 8 is such that a signal 12 is active at the base of an output transistor 11 which signal has a polarity such that the output transistor 11 is released during the horizontal stroke period and cut-off during the horizontal fly-back period.

The collector circuit of the output transistor 11 includes the primary winding 13 of a high-tension transformer 14. The secondary winding 15 of transformer 14 has one end connected to ground and its other end connected to the anode of a rectifier diode 16. The cathode of the diode is coupled to the output anode of the display tube, being the aquadag layer described in the preamble. The collector circuit of the output transistor 11 also includes a parallel diode 17 and, connected in parallel therewith, the series-combination of a capacitor 18 and a deflection coil 19. The capacitor 18 serves, on the one hand, to ensure that no direct-current component can be present in the current flowing through the deflection coil 19 and, on the other hand, to make the necessary S correction to the deflection current.

If, in the prior art circuit arrangement of FIGURE 1, flash-over occurs in the display tube (not shown), this means that the winding 15 is short-circuited during the period of conduction of the diode 16. The winding sense of the winding 15 is chosen so that the diode 16 conducts only during the horizontal fly-back period. High positive pulses are set up across the winding 15 during the fly-back period since the charge stored inductive load in the collector circuit of the output transistor 11 can decay freely during the horizontal fly-back period through the parasitic capacitance invariably present in the circuit. Thus during the horizontal fly-back period a high peak voltage will appear across the primary winding 13. This peak is stepped up by the winding 15 to a value such as is necessary for feeding the aquadag layer of the display tube.

The foregoing implies that short-circuit of the secondary winding due to flash-over in the display tube occurs only when the transistor 11 is cut-off. That such short-circuit effect still has disastrous consequences for the output transistor 11 and this in two respects may be appreciated as follows:

Short-circuit of the secondary winding 15 means that the energy recovered during the horizontal fly-back period by the provision of the diode 17 cannot be recovered upon occurrence of a short-circuit since the short-circuit is to be regarded as an increase in the losses occurring during the horizontal fly-back period. The foregoing will be explained more fully with reference to FIGURE 5*a* which shows the sawtooth current flowing through the deflection coil 19, curve 20 showing the deflection current in the absence of short-circuit and curve 21 the deflection current in the presence of short-circuit. As is well-known, the surface area enclosed by a triangle *a, b, c* is proportional to the energy recovered and a triangle *b, d, e* is proportional to the energy to be supplied to the inductive load in the collector circuit of the transistor 11, so that the difference between the surfaces of the triangles *b, d, e* and *a, b, c* is proportional to the losses occurring in the circuit. These losses are determined by the ohmic resistance in the circuit, which may be maintained very low, and the energy which will be consumed by the display tube itself and which is proportional to the high voltage generated and the intensity of the electron ray.

If short-circuit occurs this implies that the losses greatly increase. This means that the surface of the triangle which is proportional to the recovered energy shrinks to form the triangle *a, b′, c′* and that the energy which, upon short-circuit, must be supplied to the inductive load during the stroke time increases so that the triangle *b, d, e* changes to a triangle *b′, e, d′*, and the line *c′, d′*, which is determined by the ratio between the energy recovered and the energy supplied, yields a curve 21 which clearly shows that the peak current flowing through the transistor 11 has increased from a value *e, d* to a value *e, d′*.

The first-mentioned effect has already unpleasant consequences for the transistor. First its peak current considerably increases upon any short-circuit occurring and since a transistor, which is usually controlled into saturation, has a very low impedance no limiting factors are present in the collector circuit to ensure that the peak current is limited to a permissible value. As a result, not only the peak current but also the mean current increases considerably so that the transistor must be able to withstand not only a greater peak current but also greater dissipation upon any short-circuits occurring. This implies that, in order to prevent the transistor from being deteriorated because of such short-circuit, it must be proportioned more heavily than is necessary for normal operation.

However, in addition, a second effect occurs which has disastrous consequences especially for a transistor so that it may still be deteriorated even if steps were taken to limit the current flowing through a transistor to a reasonable value.

This second effect is caused by the fact that, if the secondary winding 15 is short-circuited during the fly-back, the fly-back period of the output circuit of transistor 11 varies, for the display tube constitutes not only an ohmic load but also a capacitive load and in view of the fact that stray inductance will invariably exist between the secondary winding 15 and the primary winding 13 of transformer 14, said capacitance mixed with the stray inductance will determine the fly-back period of the whole output circuit of transistor 11. If the secondary winding 15 is short-circuited not only the ohmic load but also the capacitive load disappears. This means that the fly-back period is considerably reduced so that the voltage set up across the primary winding 13 during the fly-back period increases immediately after the transistor 11 is cut-off, more rapidly than in normal operation.

This will be explained more fully with reference to FIGURE 5*c*. In this figure curve 22 shows the voltage $V_{ce}$ between the collector and emitter of transistor 11 during the stroke period $T-\Delta T$. The transistor 11 is cut-off at the end of the stroke period $T-\Delta T$ and the voltage between the collector and emitter will increase due to the decay effect in the collector circuit of transistor 11. In the absence of short-circuit the fly-back period will have its normal value and hence the said voltage $V_{ce}$ will increase in accordance with curve 23. However, in the presence of short-circuit, the fly-back period, as explained above, will be greatly shortened and hence the voltage $V_{ce}$ will increase in accordance with curve 24. When in this short-circuited condition the current flowing through the transistor is also considered the following image results.

Figure 5:
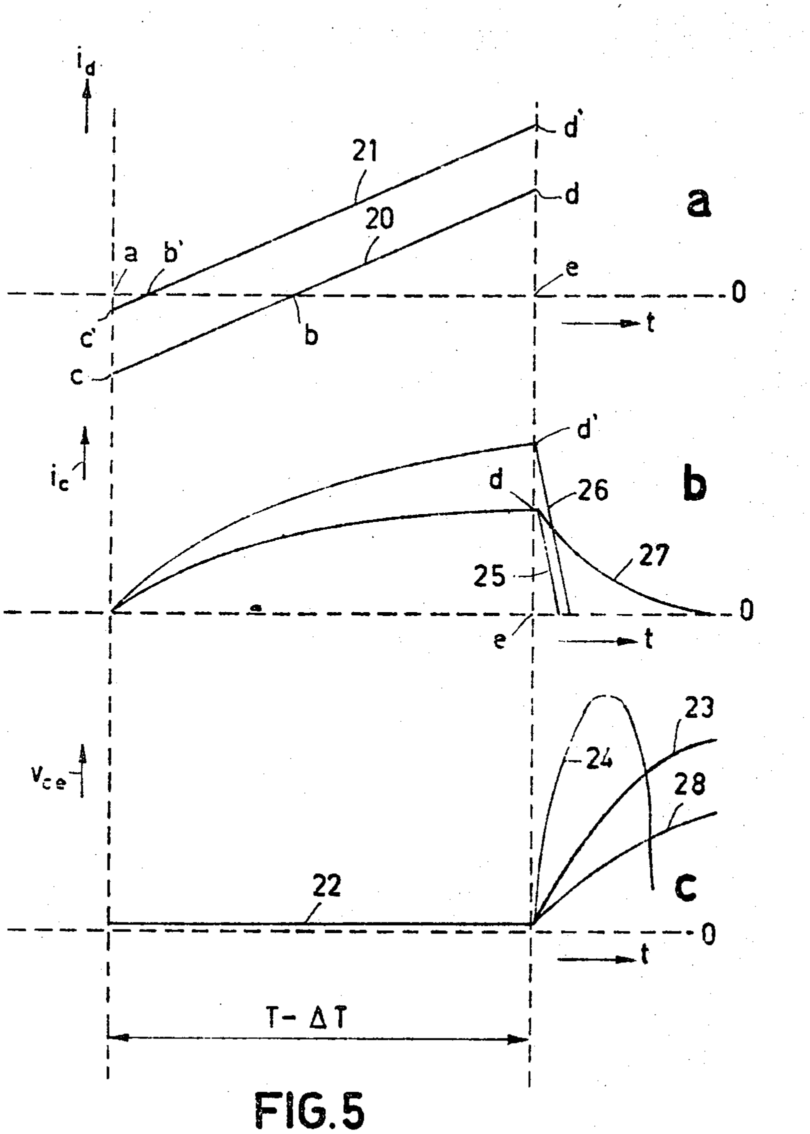
FIGURE 5 shows current-voltage diagrams which serve to explain the operation of the circuit arrangements of FIGURES 1 to 4.

As explained more fully with reference to FIGURE 5*b*, the current flowing through the transistor will acquire a peak value corresponding to the line *d*, *e* in the absence of short-circuit and a peak current of the value *d'*, *e* in the presence of short-circuit. Now, each transistor is confronted with the so-called hole-storage effect which implies that, when the control signal 12 is going to cut-off the transistor 11 after the stroke period, the transistor current cannot be reduced immediately to a zero value since the charge carriers (holes) must first be removed from the base space of the transistor 11. As a result, in normal operative conditions, the current flowing through the transistor 11 will decrease in accordance with curve 25 of FIGURE 5*b* and, in the case of short-circuit, in accordance with curve 26. When FIGURES 5*b* and 5*c* are compared with each other it follows therefrom that, during the cut-off period of transistor 11, in a short-circuited condition not only the voltage increases more rapidly (the absolute value to which the voltage increases in a short-circuited condition need, of course, not be higher than under normal operative conditions but the voltage rises at any rate more rapidly in the short-circuited condition) but also a greater current must be switched off. This again has two consequences. First the dissipation of the output transistor 11 during switching off will be considerably greater in a short-circuited condition than in normal operative conditions. This added to the greater dissipation during the stroke period is one more reason for a possible deterioration of the output transistor. The second effect is, however, that the possibility of deterioration of the transistor increases more and more as a result of the contraction effect, that is to say the effect whereby that current which still flows through the transistor 11 during switching off and the field strength thus available in the base space have the tendency to contract the current to a smaller region. It is substantially this contraction effect which, together with the greatly increasing voltage according to curve 24 and the great switching-off current according to curve 26, is responsible for the deterioration of many transistors in the short-circuited condition.

Two steps are necessary to avoid this disadvantage. First the current flowing through the output transistor 11 in the short-circuited condition must be limited so that the peak current does not or hardly exceeds the value *d*, *e*. Secondly, steps are necessary to prevent the voltage across transistor 11 upon switching-off from increasing to values so high that the contraction effect can play a part at the control voltage then appearing at the base of transistor 11.

According to the recognition of the invention the contraction effect cannot be avoided by switching-off the output transistor 11 more rapidly since the time needed to remove the charge carriers from the base space of transistor 11 may substantially be regarded as a property of the transistor employed and is substantially independent of the amplitude of the control signal 12. According to the invention, steps must therefore be taken such that in a short-circuited condition the transistor 11 is switched off more slowly instead of more rapidly, for example as illustrated by curve 27 in FIGURE 5*b*. For, when doing so, the transistor 11 will be conducting for a longer period and this means that the voltage at the collector of transistor 11 can increase less rapidly, that is to say, it will increase in accordance with curve 28 instead of in accordance with curve 24. This may readily be appreciated when considering that the voltage is given by the equation $$V = di/dt$$

where the $di/dt$ in the case of curve 26 shows a much greater slope immediately after switching off than in the case of curve 27.

Figure 2:
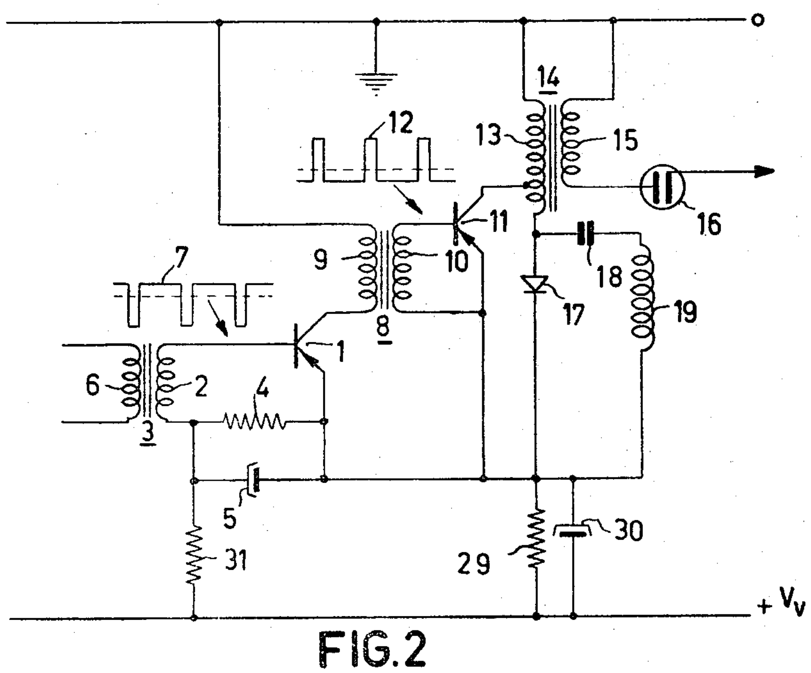
FIGURE 2 shows the circuit arrangement improved in accordance with the invention in which the output circuit of the output transistor includes a so-called parallel booster diode.

The principle of the invention is realized, if the arrangement includes a parallel diode 17, in the circuit arrangement shown in FIGURE 2. In this figure, in which corresponding parts are indicated as far as possible by the same reference numerals as in FIGURE 1, the emitters of the driver transistor 1 and the output transistor 11 are connected together. According to the invention, this through-connection is coupled to the positive terminal of the supply voltage source through a limiting impedance comprising the parallel combination of a resistor 29 which, if $V_v=15$ volts, must be for example 15/10=1.5 ohms, and a capacitor 30 of, for example, 10 $\mu$F. Of this limiting impedance the resistor 29 is the limiting element proper which ensures that, if the secondary winding 15 is short-circuited, the current flowing through the transistor 11 cannot or can hardly exceed the value *d*, *e*. The capacitor 30 serves to transmit the alternating-current components sufficiently in normal operation. If a short-circuit occurs the portion of the impedance in the collector circuit of transistor 11 which is formed by the portion of the primary winding 13 between the collector and the grounded terminal of the supply voltage source substantially disappears and only the limiting impedance remains. As a result the voltage drop across the resistor 29 increases and, considering the direction of the current in the circuit of FIGURE 2, the voltage at the emitter of transistor 11 will be negative-going. This means that the emitter of driver transistor 1 will also be negative-going and since the base thereof is also connected to the positive terminal of the supply voltage source through the secondary winding 2 and a resistor 31 of, for example, 330 ohms this means that, if any short-circuit occurs, the transistor 1 will be cut-off by the voltage set up across the resistor 29. During the fly-back period, the signal 7 tends to make the transistor 1 conducting and from this it follows that the voltage across resistor 29 and the signal 7 are voltages which counteract each other during the horizontal fly-back period.

The voltage set up across the resistor 29 upon short-circuit is preferably so high that the signal 7 is unable to release transistor 1 even during the fly-back period. However, since the magnetic energy in transformer 8 will decrease, the base current $i_b$ flowing through the secondary winding 10 will progressively decrease for the output transistor 11 when transistor 1 remains cut-off. Due to the progressively decreasing base current $i_b$, the transistor 11 is progressively cut-off, that is to say, the transistor 11 is cut-off with retardation due to transistor 1 being maintained cut-off, so that the switching-off current of transistor 11 will correspond to curve 27 in FIGURE 5*b*.

It is in principle also possible to give the resistor 29 a value such that the voltage set up across it upon short-circuit counteracts the signal voltage 7 so that a signal voltage remains which can release transistor 1, it is true, but with retardation with respect to releasing under normal operative conditions. This is attributable to the fact that a transistor is invariably made conducting with some retardation with respect to the releasing signal. This retardation will become greater as the voltage available for releasing has a lower value. Furthermore in this case the voltage available for releasing transistor 1 has a lower value so that transistor 1 is not released completely and hence the voltage which has become available at the secondary winding 10 acquires a lower value so that transistor 11 will also be cut-off less rapidly. Consequently, by through-connecting the two emitters of the transistors 1 and 11 and back-coupling the voltage across the resistor 29 to the base of the transistor, it is also achieved that the contraction effect cannot occur.

It is further to be noted that the resistor 31 is not strictly necessary for the principle of the invention. However, the said resistor is provided to prevent the resistor 29 from drastically decreasing the value of the resistance in the base-emitter circuit of transistor 1, for the resistor 4, which is shunted by the capacitor 5 for alternating current, is provided to prevent undue peak currents in the base-emitter circuit of transistor 1. Now, resistor 29 has a very low value, in the above example only 1.5 ohms, but resistor 4 has a value of 100 ohms. In the absence of resistor 31 the resistors 29 and 4 would be connected in parallel so that the total resistivity would be determined substantially only by resistor 29 the value of which is much too low to limit the peak currents in the base-emitter circuit of the transistor 1 to the desired value. This disadvantage is avoided by the provision of resistor 31.

It is true that the voltage set up across resistor 29 upon short-circuit will now be divided by the voltage divider comprising the resistors 31 and 4, but by correctly proportioning resistor 31 with respect to resistor 4 it is still possible, for a given value of resistor 29 which is necessary upon short-circuit for limiting the current flowing through transistor 11 to the desired value, that a voltage is present at the common point of the resistors 31 and 4 high enough to counteract the signal voltage 7 during the fly-back period.

The circuit arrangement shown in FIGURE 2 affords the further advantage that the resistor 29 is located outside the deflection circuit proper, for when transistor 11 is conducting, the current flows through the transistor 11, the deflection coil 19 and the capacitor 18. If, however, the diode 17 is in the conducting state the current flows through the diode 17, the deflection 19 and the capacitor 18. Since the capacitor 18, apart from the voltage drop across resistor 29, is charged substantially to the voltage $V_v$, the capacitor 18 fulfills in all these cases the function of the voltage source which is connected in parallel with the deflection coil 19 and causes a deflection current substantially linear or corrected in accordance with an S curve to flow through it. From this it appears that the linearity of the deflection of the electron ray in the display tube is not unfavourably affected by adding the resistor.

It is to be noted that the safety is active in a more or less pulsatory manner, for if short-circuit occurs transistor 11 is cut-off with retardation so that substantially no high voltage is generated and the flash-over in the display tube will also stop since such flash-over occurs only if the high tension is high enough. However, if flash-over no longer occurs, the short-circuit is also obviated and the circuit will normally be restored, that is to say, the current will again flow in accordance with curve 20 and the voltage will normally rise in accordance with curve 23 and if the dust particles present in the display tube or any other cause of flash-over has disappeared renewed flash-over will not occur. If flash-over does occur again the mechanism is repeated so that transistor 11 is again cut-off with retardation and the high tension again falls off. This will occur several times in succession until the cause of the flash-over effect is eliminated. Consequently the safety will be active in a more or less pulsatory manner.

It makes no difference whether the short-circuit is due to the said flash-over effect or occurs during service operations by means of a screw driver. In the case of a screw driver the short-circuit may last much longer than 5 to 10 line periods. In this case also the pulsatory character of the safety is maintained, for if the high tension disappears the current will also be reduced substantially to zero due to the short-circuiting screw driver so that the high tension can be restored and the same mechanism is repeated.

Figure 3:
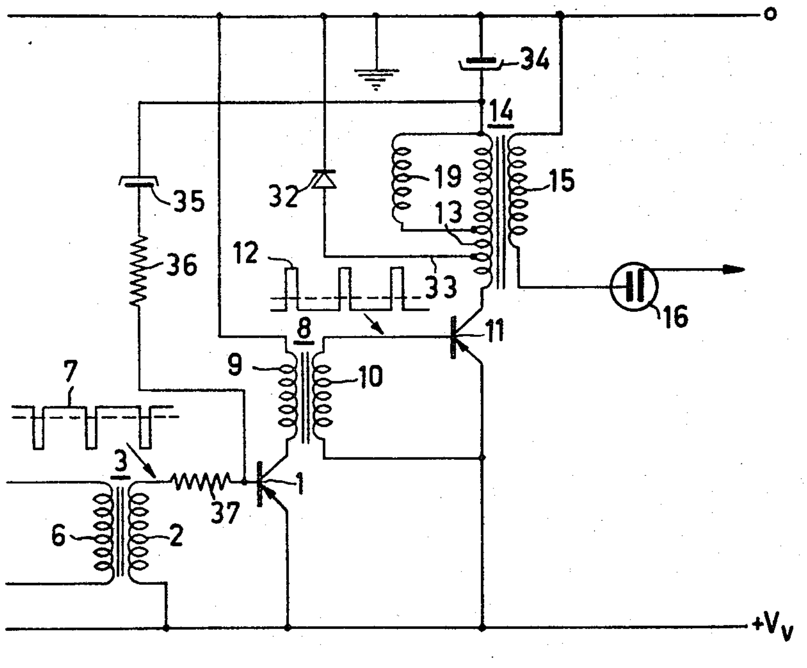
FIGURE 3 shows a line output circuit including a so-called series-booster diode and also illustrates the principle of the invention.

The embodiment shown in FIGURE 3 illustrates the manner in which the principle of the invention is applicable if a series-booster diode instead of a parallel booster diode is used. In this case a diode 32, which fulfills the function of a series-booster diode, must be connected between a tap 33 on the primary winding 13 and the grounded terminal of the supply voltage source, while one end of the winding 13 is connected to the said grounded terminal through a capacitor 34 associated with the circuit of the series-booster diode. According to the invention the said capacitor must have a value such that the voltage set up across it in normal operation falls out almost instantly or at least reaches a much lower value if the winding 15 is short-circuited. In the embodiment of FIGURE 3 this is achieved by giving the capacitor 34 a value of 500μF. This disappearance of the voltage also causes a considerable decrease in the supply voltage for the transistor 11 so that the current flowing through transistor 11 is limited to the desired value. To avoid the contraction effect, a feedback is provided from the common point of winding 13 and capacitor 34 to the base of transistor 1. This backcoupling is effected through a large capacitor 35 of, for example 10μF and a series-resistor 36 of, for example, 270 ohms. Further a series-resistor 37 of, for example 68 ohms is included between the secondary winding 2 and the base of transistor 1. The choice of capacitor 34 and resistor 36 is substantially determinative of the extent to which the transistor 1 remains cut-off or is released with retardation during the occurrence of a short-circuit, for under normal operative conditions a voltage is set up across capacitor 34 to render the electrode connected to winding 13 negative relative to the earthed terminal of the supply voltage source. That is to say the voltage across capacitor 34 has a voltage-increasing effect for the supply voltage of transistor 11. Consequently, a series-booster diode circuit will usually be employed if the direct voltage provided by the supply voltage source is too low for satisfactory operation of the line output stage. Thus, for example in the embodiment of FIGURE 2, the supply voltage $V_v$ will be, for example, 12 volts and only 6 volts in the case of FIGURE 3. A voltage of 6 volts must then be developed across capacitor 34 so that the operative conditions obtained for transistor 11 in the circuit of FIGURE 3 are again the same as those in FIGURE 2. However, if short-circuit now occurs, the negative voltage across capacitor 34 will be substantially disappear, that is to say, the voltage at the common point of winding 13 and capacitor 34 is positive-going and this positive-going voltage is transferred through capacitor 35 and resistor 36 to the base of transistor 1, thus tending to cut-off the said transistor. Similarly as in the embodiment of FIGURE 1, it is then necessary that this cutting-off shall not be complete but, in co-action with the pulsatory signal 7, such that the transistor 1 is made conducting with retardation and hence transistor 11 is cut-off with retardation, resulting again in a current variation corresponding to curve 27.

It will be evident that, due to the presence of capacitor 35, a direct-current component cannot reach through resistor 36 the base of transistor 1. However, as has been described for the embodiment of FIGURE 2, due to the short-circuit occurring and due to the fact that transistor 11 is cut-off with retardation, substantially no high tension will be produced so that the flash-over in the display tube will also stop. Consequently, the safety will be active in a more or less pulsatory manner also in the case of FIGURE 3. The choice of resistor 36 in conjunction with the choice of capacitor 34 ensures that such pulsations cannot occur under normal operative conditions.

It is further to be noted that, in the embodiment of FIGURE 3, no capacitor is included in series with the deflection coil 19. If, however, sufficient S correction is desired it is possible also in this case to include a capacitor in series with the deflection coil 19, the value of this additional capacitor thus determining the extent of the S correction.

Figure 4:
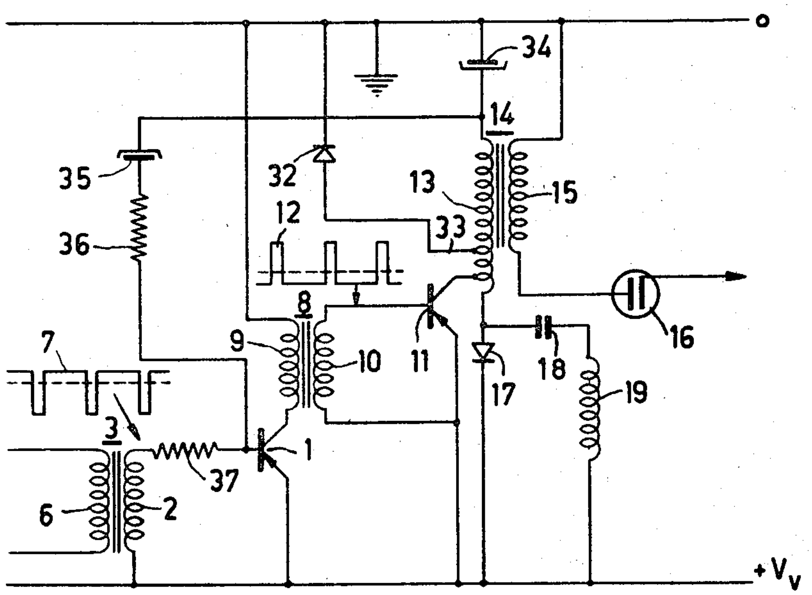
FIGURE 4 shows a circuit arrangement similar to that of FIGURE 3 but which includes not only a series-booster diode but also a parallel booster diode.

Lastly, FIGURE 4 shows a circuit diagram which includes both a series-booster diode 32 and a parallel diode 17. The circuit arrangement of FIGURE 4 operates, with regard to the safety, in a similar manner as that of FIGURE 3. It would fundamentally also be possible to make it operate on the principle of FIGURE 2 since a parallel booster diode is included in it.

The parallel booster diode has the advantage that the voltage across the deflection coil 19 will be maintained substantially constant during the stroke and this means a substantially constant amplitude of the deflection current flowing through the deflection coil 19, irrespective of the high-tension load, that is to say, irrespective of the intensity of the electron ray in the display tube. If a series-booster diode only is available it would be necessary to take additional steps to prevent variation in the amplitude of the deflection current upon varying high-tension load. The circuit arrangement of FIGURE 4 is therefore applicable if a low supply voltage $V_v$ is used and the current flowing through the deflection coils must nevertheless remain substantially constant upon varying high-tension load.

In the foregoing it has always been assumed that the parasitic capacitance in the collector circuit of transistor 11 is sufficient to obtain the desired fly-back period. However, the said parasitic capacitance is usually too small for this purpose and the desired fly-back period may be obtained by connecting an additional capacitor in parallel with the diode 17 or, in the embodiment of FIGURE 3, in parallel with the coil 19.

It will also be evident that, instead of using an ordinary transformer 14 having separate primary and secondary windings, it is also possible to use a high-tension transformer designed as an autotransformer in which the winding 15 is simply a through-winding of the winding 13.

The transformers 3 and 8 are not strictly necessary. By means of a simple capacitive coupling between the transistors 1 and 11 it is also possible to ensure that the pulsatory signal amplified in the driver transistor 1 reaches the base of transistor 11 with the correct polarity and the same holds good for the supply of the input signal 7. The essential point is only that, if transformer 3 is not used, the input impedance in the base circuit of transistor 1 has a value such that the voltage developed across the limiting impedance, after being backcoupled, finds an impedance in the base circuit of transistor 1 sufficiently high to be able, upon occurrence of short-circuit, not to release the said transistor during a fly-back period or only with retardation.

In the foregoing it has been taken for granted that the pulses 7 were present. These pulses 7 may be separated line-synchronisation pulses which are fed for direct synchronisation to the driver transistor 1, or may be obtained from a local oscillator. This local oscillator, which must be synchronized by the line-synchronisation pulses, may be of the relaxation type or be designed as a sine oscillator in which latter event the pulsatory signal 7 must be derived from the sinusoidal signal by limitation.

Figure 6:
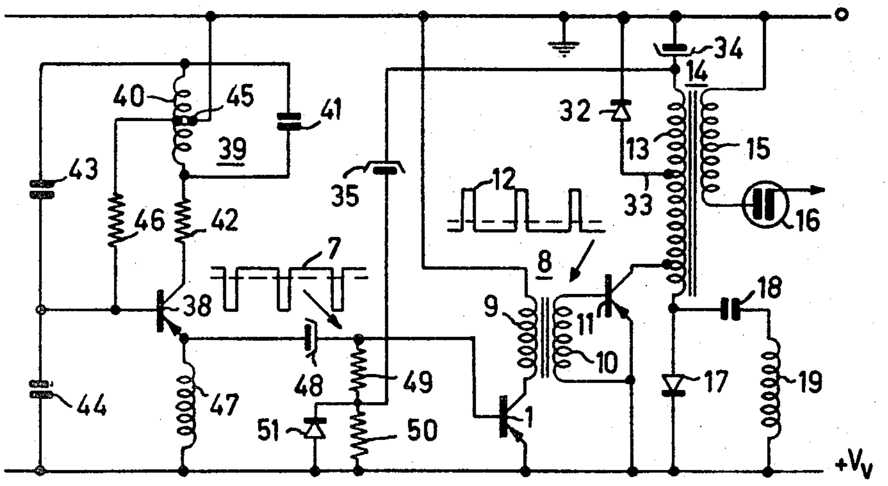
FIGURE 6 shows a circuit arrangement similar to that of FIGURE 4 but which includes in addition, a transistor connected as a Hartley oscillator which directly produces the pulsatory control voltage for the driver transistor.

An example of the latter is shown in FIGURE 6. In this figure a transistor 38 is connected as a Hartley oscillator and for this purpose a tuned circuit 39 comprising an inductor 40 and a capacitor 41 is connected, at one end, through a limiting resistor 42 to the collector and, at its other end, through a capacitive voltage divider comprising capacitors 43 and 44 to the base of the transistor 38. A tap 45 on the inductor 40 is connected, on the one hand, to ground and, on the other, through a resistor 46 to the base of transistor 38 in order to obtain the desired direct-current adjustment for this base. Lastly, the emitter is connected through a choke 47 to the positive terminal.

The collector resistor 42 serves, on the one hand, to permit the circuit 39 to resonate during the current-conveying periods of the transistor 38 and, on the other hand, to limit the collector current so that the collector current and hence the emitter current of transistor 38 have a more or less pulsatory character. Thus a pulsatory voltage is set up across both resistor 42 and choke 47. In connection with the required polarity of the control signal for the driver transistor 1, the control signal is derived from the emitter and applied as a control voltage 7 through a capacitor 48 to the base of the driver transistor 1.

The base of the driver transistor 1 is also connected through resistors 49 and 50 to the positive terminal, resistor 50 being shunted by a diode 51.

Similarly as in the embodiment of FIGURES 3 and 4, in the example of FIGURE 6 the voltage across capacitor 34 is fed back for alternating current to the base circuit of transistor 1. To this end, as before, capacitor 35 is connected between the common point of winding 13 and capacitor 34 and the common point of the resistors 49 and 50. A positive pulse produced upon short-circuit is thus applied, as before, through capacitor 35 to the common point of the resistors 49 and 50 and delays the release of driver transistor 1 by means of the negative pulses and the control signal 7 and thus the cutting-off of output transistor 11. The extent of retardation is in this case determined by the RC time of the capacitors 34, 35 and 48 and the resistors 49 and 50, for dependent upon this RC time the positive pulse appearing upon short-circuit will after some time again be reduced to zero and the control signal 7 can again normally control the transistor 1. If the short-circuit is then not terminated a new positive pulse is developed and the process repeated.

The resistor 50 is shunted by a diode 51 in order to avoid overcontrol of the driver transistor when, after the end of the short-circuit, the voltage across capacitor 34 again acquires its normal value, for after termination of the short-circuit the increase in voltage at the common point of winding 13 and capacitor 34 again becomes negative-going and this negative-going increase is again transferred through capacitor 35 to the base circuit of transistor 1. The said negative-going voltage assists in releasing the transistor so that, unless special steps are taken, the current flowing through transistor 1 immediately after a short-circuit would become excessive. To avoid this, the diode 51 is provided which prevents the negative-going rise in voltage.

Although both the parallel diode 17 and the series-booster diode 32 are shown in the circuit diagram of FIGURE 6, it will be evident that the parallel diode 17 may be omitted in FIGURE 6 in which event the deflection coil 19 must be connected in a manner as shown in FIGURE 3, but the remainder of the arrangement remains unchanged.

In the arrangement of FIGURE 2 it may likewise be important to provide a limiting diode.

It is further to be noted that, although in the foregoing a deflection coil 19 has invariably been included in the circuit, this is not strictly necessary. The principle of the invention holds good even in those cases where only a high voltage must be generated, for in this case also a capacitive-inductive load will be present in the collector circuit of transistor 11 even through the inductance has a lower value due to the absence of the deflection coil 19. In this case also it will be necessary to ensure that the output resistor 11 is not deteriorated upon flash-over occurring in the display tube.

Lastly, it is to be noted that it is not strictly necessary to connect the negative terminal of the supply voltage source to ground and the positive terminal can be grounded as well. Also it is not strictly necessary to use pnp type transistors, the principle of the invention holding good without restriction of npn type transistors are used instead, in which event the polarity of the supply voltage $V_v$ must also be reversed.

What is claimed is:

1. A transistor circuit for producing a high voltage, of the type comprising a driver transistor, an output transistor having an output circuit which includes a capacitive-inductive load, a supply voltage source for feeding the driver and output transistors, means for supplying a substantially pulsatory signal to an input electrode of the driver transistor, said signal having a polarity to cut-off the driver transistor for the greater part of a cycle of the input signal and to release it during the remaining part of a cycle, means for coupling said driver and output transistors whereby the output transistor is conducting when the driver is cut-off and conversely, a transformer connected in the output circuit of the output transistor and having a high voltage winding for stepping up the pulsatory voltage set up across the capacitive-inductive load during the period when the output transistor is cut-off, and a rectifier circuit for rectifying the pulsatory voltage stepped up by said transformer; wherein the improvement comprises means for safeguarding said output transistor upon occurrence of a short-circuit at said high voltage winding, said safeguarding means comprising a limiting impedance connected in series with the load on the output transistor, a negative feedback circuit connected between said limiting impedance and said driver transistor to ensure that the voltage developed across the load impedance upon occurrence of the said short-circuit is fed back to the input electrode of the driver transistor with a polarity such that the release of the driver transistor by the input signal is counteracted.

2. A transistor circuit as claimed in claim 1, of the type in which a booster diode is connected in parallel with the output transistor and in which one terminal of the supply voltage source is coupled to the emitters and the other terminal is connected through the required impedances to the collectors of the driver and output transistors, wherein said negative feedback circuit comprises means for connecting the emitters of the driver and output transistors together, means for connecting said limiting impedance between said emitters and the first-mentioned terminal of the supply voltage source, and means connecting the base of the driver transistor to said first-mentioned terminal.

3. A transistor circuit as claimed in claim 2, in which a series-booster diode is connected between a tap on the transformer, and said other terminal of the supply voltage source, and a capacitor associated with the circuit of the series-booster diode is connected between one end of the primary winding of the transformer and said other terminal of said supply voltage source.

4. A transistor circuit as claimed in claim 1, of the type comprising a series-booster diode connected between a tap on the transformer and one terminal of the supply voltage source, to a capacitor associated with the circuit of the series-booster diode connected between one end of the primary winding of the transformer, and said one terminal of said supply voltage source, and means connecting the other terminal of the supply voltage source to the emitters of the driver and output transistors; characterized in that the value of the capacitor is such that the voltage set up across it in normal operation disappears almost instantly upon short-circuit in the rectifier circuit, and said negative feedback circuit comprises means connecting the common point of the said capacitor and the end of the primary winding to the base of the driver transistor.

5. A transistor circuit as claimed in claim 4, comprising a parallel diode connected in parallel with the output transistor.

6. A transistor circuit as claimed in claim 1, comprising an ohmic resistor connected between the base and the emitter of the driver transistor, and a diode shunting at least part of said resistor whereby the pulse releasing the driver transistor which occurs after the end of said short-circuit is limited at said high voltage winding.

7. A transistor circuit for the production of a high voltage, comprising a driver transistor, means biasing said driver transistor to be normally cut-off, a source of a pulsatory input signal, means applying said signal to the base of said driver transistor with a polarity to cause conduction in said driver transistor, an output transistor, means coupling the collector of said driver transistor to the base of said output transistor whereby the conductive states of said driver and output transitors are opposite, a source of operating potential having first and second terminals, a transformer having a primary and a secondary winding, means connecting at least part of said primary winding between the collector of said output transistor and said first terminal, whereby the voltage developed across said primary winding when said output transistor is cut-off is stepped up by said secondary winding to produce a high voltage, rectifier means for rectifying said high voltage, diode means, means connecting said diode means between the emitter and collector of said output transistor, a limiting impedance connected between the emitter of said output transistor and said second terminal for limiting the curent through said output transistor, and means for connecting the emitter of said output transistor to the emitter of said driver transistor whereby the voltage developed across said limiting impedance in the event of a short circuit of said secondary winding has a polarity as applied to the emiter of said driver transistor to oppose the conduction of said driver transistor due to said input signal.

8. The circuit of claim 7 adapted for use in a deflection circuit, comprising a series circuit of a capacitor and defletion coil means connected in parallel with said diode.

9. A transistor circuit for the production of a high voltage, comprising a driver transistor, means biasing said driver transistor to be normally cut-off, a source of a pulsatory input signal, means applying said signal to the base of said driver transistor with a polarity to cause conduction in said driver transistor, an output transistor, means coupling the collector of said driver transistor to the base of said output transistor whereby the conductive states of said driver and output transistors are opposite, a source of operating potential having first and second terminals, a transformer having a primary and a secondary winding, a series circuit of a capacitor and said primary winding connected in that order between said first terminal and the collector of said output transistor, a series-booster diode connected between a tap on said primary winding and said first terminal, means connecting the emitter of said output transistor to said second terminal, whereby the voltage developed across said primary winding when said output transistor is cut-off is stepped up by said secondary winding to produce a high voltage, rectifier means for rectifying said high voltage, said capacitor having a value such that the voltage thereacross substantially disappears in the event of a short circuit on said secondary winding, and capacitor means for applying the voltage across said capacitor to the base of said driver transistor, whereby a voltage opposing said input signal is applied to the base electrode of said driver transistor in the event of a short circuit on said secondary winding.

10. The circuit of claim 9 adapted for use in a deflection circuit, comprising deflection coil means connected in parallel with at least a part of said primary winding.

11. The circuit of claim 9 adapted for use in a deflection circuit, comprising diode means connected between the emitter and collector of said output transistor, and a series circuit of a capacitor and deflection coil means connected in parallel with said diode means.

References Cited

UNITED STATES PATENTS

| | | | |
|---|---|---|---|
| 2,954,504 | 9/1960 | Saudinaitis et al. | 307—88.5 |
| 3,229,151 | 1/1966 | Attwood | 315—27 |
| 3,247,419 | 4/1966 | Attwood | 315—27 |
| 3,287,594 | 11/1966 | Wada | 315—27 |

JOHN F. COUCH, *Primary Examiner.*

W. H. BEHA, *Assistant Examiner.*